United States Patent [19]

Gerard et al.

[11] 4,134,087

[45] Jan. 9, 1979

[54] AMPLITUDE WEIGHTED SURFACE ACOUSTIC WAVE DEVICE

[75] Inventors: Henry M. Gerard, Capistrano Beach, Calif.; Philip B. Snow, Beaverton, Oreg.

[73] Assignee: Hughes Aircraft Company, Culver City, Calif.

[21] Appl. No.: 785,814

[22] Filed: Apr. 8, 1977

[51] Int. Cl.² .................. H03H 9/04; H03H 9/32; H01L 41/10
[52] U.S. Cl. ...................... 333/72; 310/313; 333/30 R
[58] Field of Search .............. 333/30 R, 71, 72, 70 T; 310/313; 331/107 A; 330/5.5

[56] References Cited

U.S. PATENT DOCUMENTS

| 3,446,974 | 5/1969 | Seiwatz .............................. 333/72 X |
| 3,894,251 | 7/1975 | Shibayama et al. .................. 310/313 |

*Primary Examiner*—Alfred E. Smith
*Assistant Examiner*—Marvin Nussbaum
*Attorney, Agent, or Firm*—John Holtrichter, Jr.; W. H. MacAllister

[57] ABSTRACT

A surface acoustic wave device embodying a novel technique of weighting the tapping amplitude of an interdigital surface acoustic wave transducer, the amplitude weights being implemented by means of planar resistors deposited so that one is connected in series with each sampling electrode of the interdigital transducer.

2 Claims, 4 Drawing Figures

Fig. 1.
PRIOR ART
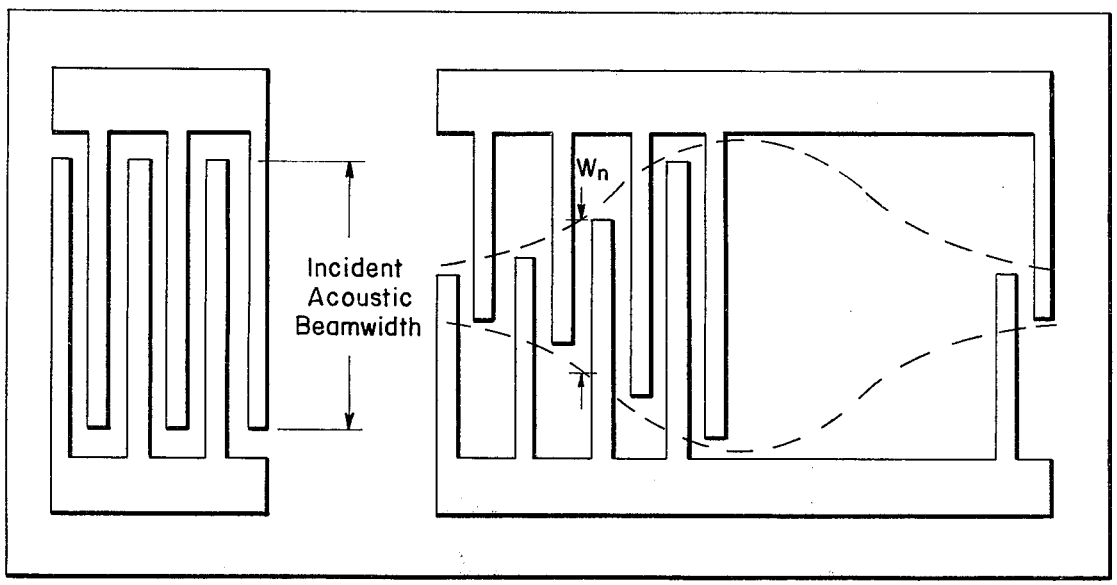
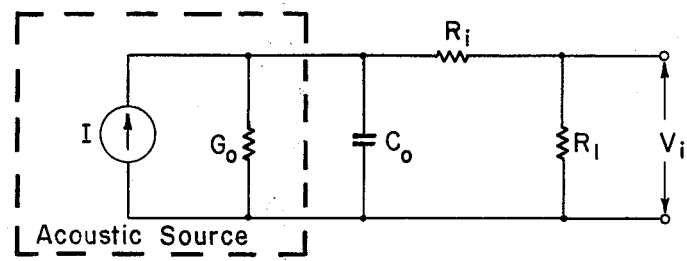
Fig. 4.

AMPLITUDE WEIGHTED SURFACE ACOUSTIC WAVE DEVICE

BACKGROUND OF THE INVENTION

The background of the invention will be set forth in two parts.

1. Field of the Invention

This invention relates to surface acoustic wave devices and more particularly to such device incorporating improved interdigital transducers.

2. Description of the Prior Art

Basically, a surface acoustic wave (SAW) device comprises a source of an electrical input signal, a smooth slab-like element or substrate of material capable of propagating such acoustic energy, and a load or utilization device. Additionally, electroacoustic transducers are attached to the substrate to convert the input signal to surface waves in the material, and vice versa.

In the most common designs, a piezoelectric material such as lithium niobate or quartz, for example, is used as the surface wave medium, and the transducers employed are the interdigital array type. This type of array consists of a series of conductive electrodes that form a comb-like pattern which is disposed on the piezoelectric substrate surface. The interdigital transducer is a two-terminal device having two separate components of metal strips resembling interleaved fingers. In the case of an input transducer, the adjacent fingers have predetermined potentials and polarities causing a strain field to be set up between the electrodes in the surface of the substrate. The surface acoustic wave energy created by the strain field propagates along the substrate surface and creates potentials in adjacent electrodes of an output transducer disposed in the path and intercepting such propagating energy.

The gap between adjacent electrodes can be viewed as an isolated source of acoustic signal (or tap when viewed as a receiver element). The response of this type of transducer is thus the sum of the sources in the array. In order to realize a prescribed response, it is necessary to control the relative amplitudes of the respective sources.

The standard prior art technique used to provide this desired control is to vary the electrode overlap dimensions proportional to the required weighting. This is commonly denoted as "apodization", which is described in many articles on the subject, one of which is "Acoustic Surface Wave Filters" by R. H. Tancrell and M. G. Holland, in the Proceedings of the IEEE, Vol. 59, pages 393–409, March 1971.

Although providing the desired primary result, this technique has certain undesirable second order effects where there is a relatively small electrode overlap (less than 25%, for example). There are two limitations involved: first, is acoustic diffraction, or beam spreading, which produces errors in the amplitude and phase of the source radiation. These errors become significant when the overlap dimension is small. The second problem is that acoustic radiation emanates from the region beyond the ends of the electrodes, in addition to the overlap region. This component produces a significant error in the effective tap weight when the overlap dimension is small. In a practical prior art SAW filter, for example, these errors limit achievable out-of-band rejection to roughly −30 dB and produce similar errors in other types of SAW devices.

There are still other significant problems to contend with in prior art SAW devices using apodization. For example, it is very difficult to acquire and maintain the close tolerances required in the fabrication of the transducers on the substrate surface, and in the prior technology, only one of the two transducers in a filter pair could be accurately weighted. Further, once the mask used for fabricating the apodized transducer has been completed, the impulse response cannot be modified.

As can be seen from the above, amplitude weighting is a general requirement for all surface acoustic wave transducers. That is, it is always necessary that the impulse response of the surface wave transducer has some prescribed amplitude variations. In contrast to the prior art techniques, the invention as will herein be described utilizes resistive weighted transducers which have the advantages of being more accurate and easier to fabricate than through the use of prior techniques. Furthermore, the present implementation is compatible with the use of two resistive weighted transducers, combining to form a single surface acoustic wave filter, as compared to prior technology where only one transducer in a filter pair could be accurately weighted. The present invention may also yield twice the out-of-band filter rejection that was previously obtainable. An additional advantage of the resistive weighted transducer technique lies in the relative ease with which the amplitude of the measured impulse response can be trimmed and modified in comparison with prior techniques.

Another prior art technique which should perhaps be mentioned utilizes the selected positioning of the tapping electrode at prescribed angles to the incident surface acoustic wave beam. As this latter technique offers far less flexibility than either apodization or the resistive weighted technique, and since the latter is also far more sensitive to fabrication errors, it has not received wide usage.

SUMMARY OF THE INVENTION

In view of the foregoing factors and conditions of the prior art, it is a primary object of the present invention to provide a new and improved amplitude weighted surface acoustic wave device.

Another object of the present invention is to provide an easy-to-fabricate and adjust amplitude weighted surface acoustic wave device for use as a band pass filter, or delay line, or the like, that has improved selectivity and out-of-band rejection.

Still another object of the present invention is to provide a new amplitude weighted surface acoustic wave device exhibiting minimal deleterious effects of acoustic diffraction.

Yet another object of the present invention is to provide an amplitude weighted surface acoustic wave device wherein two resistive weighted transducers combine to form a single surface acoustic wave filter.

In accordance with the present invention, an amplitude weighted surface acoustic wave device includes transducer means including at least one resistive weighted transducer array having an interdigital electrode structure disposed on the surface of the substrate of piezoelectric material, the surface being capable of supporting propagating surface acoustic wave energy, and the electrode structure including resistors integrally formed therein to produce a desired amplitude weighted impulse response.

In certain embodiments of the invention, two resistive weighted transducers are disposed on the substrate surface to form a single, accurately weighted, surface acoustic wave filter. The resistive elements are planar and disposed in series with the sampling electrodes of the electrode structure. The structure may be fabricated in a single step two-metal configuration where a high resistivity layer is disposed beneath a low resistivity layer of a different metal so that the upper layer may be etched or otherwise partially removed to adjust for a desired series resistance.

The features of the present invention which are believed to be novel are set forth with particularity in the appended claims. The present invention, both as to its organization and manner of operation, together with further objects and advantages thereof, may best be understood by making reference to the following description, taken in conjunction with the accompanying drawings in which like reference characters refer to like elements in the several views.

BRIEF DESCRIPTION OF THE DRAWINGS

FIG. 1 illustrates a typical prior art configuration for the design of surface acoustic wave filters with electrode overlap tap weighting;

FIG. 4 is a simplified equivalent circuit of a single resistive weighted transducer tap showing weighting resistor $R_i$.

DESCRIPTION OF THE PREFERRED EMBODIMENTS

Figure 2:
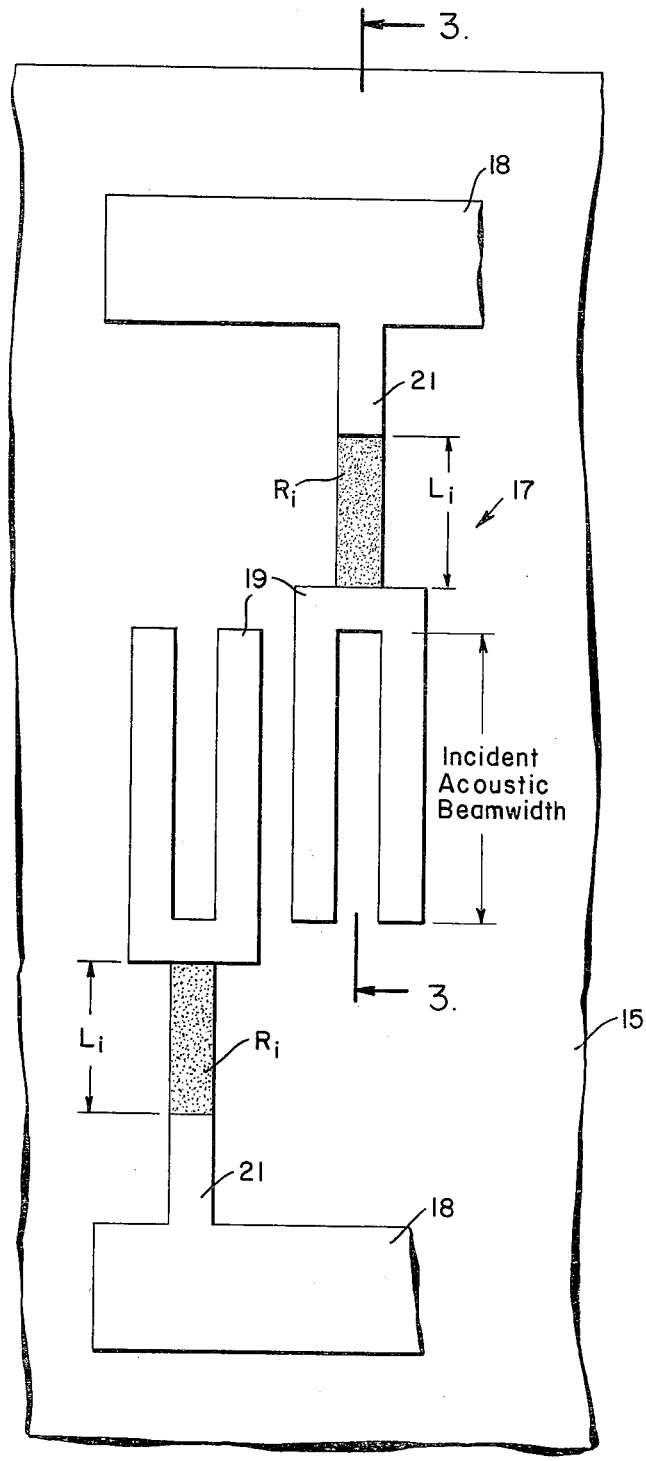
FIG. 2 is an enlarged plan view of an individual resistive weighted transducer tapping element showing the resistor region of length $L_i$.

Referring now to the drawings and more particularly to FIG. 1, there is shown a general transducer configuration for the design of surface acoustic wave filters, demonstrating the use of electrode overlap apodization for implementing tap weights. With this technique, the sampling amplitudes (tap weights) are controlled by the electrode overlap dimension $W_n$.

Figure 3:
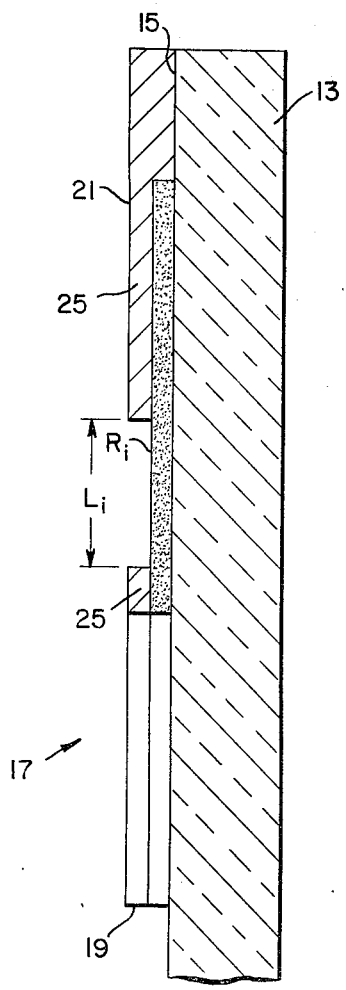
FIG. 3 is a side elevational view of a portion of FIG. 2.

On the other hand, the novel feature of the resistive weighted transducer configuration in accordance with the present invention is the implementation of tap weights by means of resistors which form an integral part of the electrode structure, as shown in FIGS. 2 and 3.

FIG. 2 shows an amplitude weighted surface acoustic wave device 11 including a substrate of piezoelectric material 13 having a surface 15 capable of supporting propagating surface acoustic wave energy. Disposed on the surface 15 is a portion of a resistive weighted transducer array 17 disposed between and in contact with contact pads 18 and having an integral electrode structure 19 that includes a resistive section $R_i$ (one pair being shown) integrally formed in the structure 19 to produce a desired amplitude weighted impulse response.

In order to control the strength of the surface acoustic wave tap, the length $L_i$ of the resistive section $R_i$ of the electrode/resistor element 21 is varied. For strong taps, the length $L_i$ is relatively small, and relatively larger for weaker taps. The required resistive section lengths may be implemented throughout the resistive weighted transducer by a photolithography process. Through the use of precision photomasks, the resistive section length, $L_i$, can be carefully controlled, and by using the combination of a two-metal, two photomask lithography process, to be described, the resistive weighted transducer array 17 may be easily fabricated.

The principal of operation of the resistive weighted transducer is best described using the circuit diagram of FIG. 4. The incident surface acoustic wave beam is represented by an equivalent signal source, I, having a characteristic admittance, $G_o$. The tapping region of each tap has capacitance, $C_o$, in series with a resistive section, $R_i$. Since the tapping regions are uniform, each tap has the same capacitance; however, the resistance of each resistive section will in general vary from tap to tap. The passage of an acoustic signal under a tap produces a voltage on the electrode. A resistive section $R_i$ and the load resistance for the system, $R_l$, form a voltage divider which drops the voltages across the load resistance to the desired level. Thus, if the length, $L_i$, of the resistive section, $R_i$, is zero, that tap would exhibit the strongest tapping amplitude, and if the resistive section length were large, the tap amplitude would be correspondingly decreased.

In general, when designing a surface acoustic wave filter, the electrode positions in the resistive weighted transducer are determined in the same manner as for filters using apodization, such as shown in FIG. 1, for example. That is, the electrodes are placed such that the acoustic signal is sampled at times for which the desired filter impulse response is real. Based upon the circuit in FIG. 4, the resistive weighted transducer resistors are related to the desired impulse response amplitude by:

$$R_i = R_l \left[ V_i \sqrt{1 + \left( \frac{X_o}{R_l} \right)^2 [1 - V_i^2]} - 1 \right],$$

where $V_i$ is the relative amplitude of the desired impulse response at time $T_i$, $R_l$ is the load resistor and $X_o$ is the reactance of one tapping electrode.

In an amplitude weighted surface acoustic wave device constructed in accordance with the present invention, the desired impulse response has a sin x/x shape in order to yield a rectangular pass band. Consequently, the lengths of the resistive sections, $L_i$, were related to the sin x/x function, which for this case was truncated after two sidelobes on either side of the main lobe.

Referring again to FIGS. 2 and 3, the electrode/resistor tapping elements 21 may be two-metal structures deposited in a single evaporation, for example. The depositions are controlled to produce a high resistivity layer 23 beneath a low resistivity layer 25 of a different metal, such as, chrome under copper. A conventional mask (not shown) defining the region to be protected from acid when the electrodes are etched back to the high resistivity layer is utilized to provide the desired resistor length, $L_i$. This two-step lithography process produces a resistive weighted transducer filter having low resistance over the acoustic wave tapping region and uniform high resistivity segments of the desired length on each electrode.

Although chrome and copper may be used to fabricate the invention, the technique is quite general for any materials which could provide the required high resistance and low resistance regions. Another technique which may be utilized in practicing the invention uses photo-conducting material for the resistive region. The use of such material would allow the tap amplitude strength to be controlled by means of external illumination. Still another variation utilizes a pair of resistive weighted transducers arranged so that one is in phase and the second in phase quadrature. By proper choice of the amplitude weights on each tap, the responses of the two transducers can be summed in order to provide both amplitude and phase weighting over a wide range.

From the foregoing, it should be evident that there has herein been described a highly advantageous amplitude weighted surface acoustic wave device which is usable as a band pass filter, or delay line, or the like, and which does not exhibit the deleterious effects heretofore associated with amplitude weighting.

It should be understood that the materials and processes used to fabricate the various embodiments of the invention are not critical, and any material or process exhibiting similar desired characteristics and providing the desired structure may be substituted for those herein mentioned.

Although the present invention has been shown and described with reference to particular embodiments, nevertheless various changes and modifications which are obvious to persons skilled in the art to which the invention pertains are deemed to lie within the spirit, scope and contemplation of the invention.

What is claimed is:

1. An amplitude weighted surface acoustic wave device, comprising:
    a substrate of piezoelectric material having a surface capable of supporting propagating surface acoustic wave energy;
    transducer means including at least one resistive weighted transducer array having an interdigital electrode structure disposed on said surface for producing a desired amplitude weighted impulse response, said electrode structure including electrode/resistor tapping elements which are two-metal structures with a relatively lower resistivity layer initially disposed above a relatively higher resistivity layer of a different metal, the upper layer of at least one of said elements being at least partially removed leaving a desired uncovered length of said higher resistivity layer.

2. The amplitude weighted surface acoustic wave device according to claim 1, wherein said lower resistivity layer is copper, and said higher resistivity layer is chrome.

* * * * *